United States Patent
Šik et al.

(10) Patent No.: US 9,355,965 B2
(45) Date of Patent: May 31, 2016

(54) SEMICONDUCTOR DEVICES AND METHODS OF MAKING THE SAME

(71) Applicant: Semiconductor Components Industries, LLC, Phoenix, AZ (US)

(72) Inventors: Jan Šik, Čeladná (CZ); Petr Kostelnik, Frenštát pod Radhoštěm (CZ); Lukáš Válek, Střítež nad Bečvou (CZ); Michal Lorenc, Frýdek-Místek (CZ); Miloš Pospíšil, Rožnov pod Radhoštěm (CZ); David Lysáček, Zašová (CZ); John Michael Parsey, Jr., Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/812,200

(22) Filed: Jul. 29, 2015

(65) Prior Publication Data
US 2015/0333016 A1    Nov. 19, 2015

Related U.S. Application Data

(63) Continuation of application No. 14/200,283, filed on Mar. 7, 2014, now Pat. No. 9,099,481.

(60) Provisional application No. 61/786,587, filed on Mar. 15, 2013.

(51) Int. Cl.
| | | |
|---|---|---|
| H01L 31/0328 | (2006.01) | |
| H01L 31/0336 | (2006.01) | |
| (Continued) | | |

(52) U.S. Cl.
CPC .......... *H01L 23/544* (2013.01); *H01L 21/2686* (2013.01); *H01L 22/20* (2013.01); *H01L 29/04* (2013.01); *H01L 29/0649* (2013.01); *H01L 29/16* (2013.01); *H01L 29/1608* (2013.01); *H01L 29/2003* (2013.01); *H01L 22/12* (2013.01); *H01L 2223/54406* (2013.01);
(Continued)

(58) Field of Classification Search
CPC .... H01L 23/544; H01L 21/2686; H01L 22/12
USPC .................. 438/308, 378, 463, 689, 690, 707; 219/121.6, 121.64, 121.69, 121.71; 257/396, 513, 586, 618, 622, 797
See application file for complete search history.

(56) References Cited

U.S. PATENT DOCUMENTS

| | | |
|---|---|---|
| 3,742,183 A | 6/1973 | Castro et al. |
| 3,752,589 A | 8/1973 | Kobayashi |
| (Continued) | | |

*Primary Examiner* — Hsien Ming Lee
(74) *Attorney, Agent, or Firm* — Noon Intellectual Property Law, P.C.

(57) ABSTRACT

In one embodiment, methods for making semiconductor devices are disclosed.

20 Claims, 6 Drawing Sheets

(51) Int. Cl.
    *H01L 27/14*                 (2006.01)
    *H01L 23/544*              (2006.01)
    *H01L 21/268*              (2006.01)
    *H01L 29/16*                (2006.01)
    *H01L 29/20*                (2006.01)
    *H01L 29/06*                (2006.01)
    *H01L 29/04*                (2006.01)
    *H01L 21/66*                (2006.01)

(52) U.S. Cl.
    CPC ............... *H01L2223/54433* (2013.01); *H01L 2223/54453* (2013.01); *H01L 2924/0002* (2013.01)

(56) References Cited

U.S. PATENT DOCUMENTS

| | | | |
|---|---|---|---|
| 4,044,222 A | 8/1977 | Kestenbaum | |
| 4,166,574 A | 9/1979 | Yokoyama | |
| 4,470,875 A | 9/1984 | Poteat | |
| 4,510,673 A | 4/1985 | Shils et al. | |
| 4,534,804 A | 8/1985 | Cade | |
| 4,597,166 A | 7/1986 | Iwai | |
| 4,732,646 A | 3/1988 | Elsner et al. | |
| 4,877,481 A | 10/1989 | Fukuda et al. | |
| 4,961,077 A | 10/1990 | Wilson et al. | |
| 5,067,437 A | 11/1991 | Watanabe et al. | |
| 5,122,223 A | 6/1992 | Geis et al. | |
| 5,175,774 A | 12/1992 | Truax et al. | |
| 5,200,798 A | 4/1993 | Katagiri et al. | |
| 5,408,320 A | 4/1995 | Katagiri et al. | |
| 5,475,268 A | 12/1995 | Kawagoe et al. | |
| 5,498,902 A | 3/1996 | Hara | |
| 5,503,962 A | 4/1996 | Caldwell | |
| 5,541,731 A | 7/1996 | Freedenberg et al. | |
| 5,543,365 A | 8/1996 | Wills et al. | |
| 5,597,590 A | 1/1997 | Tanimoto et al. | |
| 5,610,104 A | 3/1997 | Mitchell | |
| 5,733,711 A | 3/1998 | Juengling | |
| 5,761,301 A | 6/1998 | Oshima et al. | |
| 5,786,267 A | 7/1998 | Haraguchi et al. | |
| 5,877,064 A | 3/1999 | Chang et al. | |
| 5,942,136 A | 8/1999 | Mori et al. | |
| 5,956,596 A | 9/1999 | Jang et al. | |
| 6,063,695 A | 5/2000 | Lin et al. | |
| 6,112,738 A | 9/2000 | Witte et al. | |
| 6,156,676 A | 12/2000 | Sato et al. | |
| 6,187,060 B1 | 2/2001 | Nishida et al. | |
| 6,214,703 B1 | 4/2001 | Chen et al. | |
| 6,235,637 B1 | 5/2001 | Chen et al. | |
| 6,248,973 B1 | 6/2001 | Matsumura et al. | |
| 6,261,382 B1 | 7/2001 | Marx et al. | |
| 6,261,919 B1 | 7/2001 | Omizo | |
| 6,273,099 B1 | 8/2001 | Chang et al. | |
| 6,340,806 B1 | 1/2002 | Smart et al. | |
| 6,377,866 B2 | 4/2002 | Iwakiri et al. | |
| 6,387,777 B1 | 5/2002 | Hurley | |
| 6,512,198 B2 | 1/2003 | Eisele et al. | |
| 6,596,965 B2 | 7/2003 | Jeong et al. | |
| 6,624,383 B1 | 9/2003 | Lichtenstein et al. | |
| 6,632,012 B2 | 10/2003 | Vogtmann et al. | |
| 6,672,943 B2 | 1/2004 | Vogtmann et al. | |
| 6,680,458 B2 | 1/2004 | Farnworth | |
| 6,710,284 B1 | 3/2004 | Farnworth et al. | |
| 6,743,694 B2 | 6/2004 | Chung et al. | |
| 6,774,340 B1 | 8/2004 | Chiba et al. | |
| 6,914,006 B2 | 7/2005 | Peiter et al. | |
| 6,927,176 B2 | 8/2005 | Verhaverbeke et al. | |
| 6,998,090 B2 | 2/2006 | Schindler | |
| RE39,001 E | 3/2006 | Lundquist et al. | |
| 7,067,763 B2 | 6/2006 | Schramm | |
| 7,078,319 B2 | 7/2006 | Eliashevich et al. | |
| 7,148,150 B2 | 12/2006 | Lee | |
| 7,157,038 B2 | 1/2007 | Baird et al. | |
| 7,252,239 B2 | 8/2007 | Braun | |
| 7,253,428 B1 | 8/2007 | Little | |
| 7,282,377 B2 | 10/2007 | Muranaka | |
| 7,323,699 B2 | 1/2008 | Hopkins et al. | |
| 7,402,469 B1 | 7/2008 | Patterson | |
| 7,449,127 B2 | 11/2008 | Verhaverbeke et al. | |
| 7,456,113 B2 | 11/2008 | Rayandayan et al. | |
| 7,469,883 B2 | 12/2008 | Verhaverbeke et al. | |
| 7,495,240 B2 | 2/2009 | Hopkins et al. | |
| 7,665,049 B2 | 2/2010 | Muranaka | |
| 7,682,937 B2 | 3/2010 | Evertsen et al. | |
| 7,705,268 B2 | 4/2010 | Gu et al. | |
| 7,754,999 B2 | 7/2010 | Pollard | |
| RE41,924 E | 11/2010 | Nemets et al. | |
| 7,838,331 B2 | 11/2010 | Komura et al. | |
| 7,842,543 B2 | 11/2010 | Wu et al. | |
| 8,143,143 B2 | 3/2012 | Buchine et al. | |
| RE43,400 E | 5/2012 | O'Brien et al. | |
| RE43,487 E | 6/2012 | O'Brien et al. | |
| 2012/0204936 A1 | 8/2012 | Tsai et al. | |

SEMICONDUCTOR DEVICES AND METHODS OF MAKING THE SAME

CROSS-REFERENCE TO RELATED APPLICATIONS

The application is a continuation of U.S. application Ser. No. 14/200,283, filed Mar. 7, 2014, now U.S. Pat. No. 9,099,481, which claims the benefit of priority to U.S. Application No. 61/786,587, filed Mar. 15, 2013, which is hereby incorporated by reference in its entirety.

BACKGROUND

The present application relates, in general, to electronics, and more particularly, to semiconductors, structures thereof, and methods of forming semiconductor devices.

In the past, the semiconductor industry has utilized various methods to form semiconductor devices. Semiconductor wafers can be used as the substrates for production of semiconductor devices. A substrate wafer can be made of a bulk semiconductor material such as silicon or a bulk material with a top layer, for example deposited using a homo- or hetero-epitaxial deposition process, or a wafer bonding process.

Semiconductor substrates can be processed in highly-automated wafer fabs that use identification of each wafer. Also, engineering tests may have required additional identification of the processed wafers. Such identification can be provided with laser scribing on the wafer. A laser beam can be used to locally melt the material and thereby a visible "spot" was produced. From such spots symbols can be created. In some cases it was difficult for equipment to read the identification marked onto the wafers. If the identification markings could not be read, it was difficult or impossible to use the wafers in the automated fabs.

Accordingly, it is desirable to have a method of forming a semiconductor device that facilitates laser marking, and a method of marking a semiconductor device that improves the markings.

BRIEF DESCRIPTION OF THE DRAWINGS

Embodiments of present application will become more fully understood from the detailed description and the accompanying drawings, which are not intended to limit the scope of the present application.

Figure 1A:
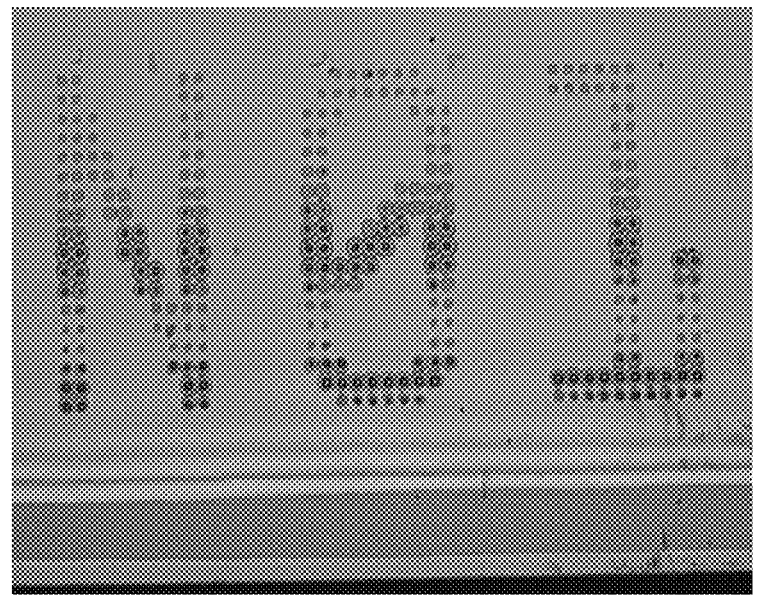
FIG. 1A illustrates one example of identification marks formed by prior laser marking methods on a silicon-on-insulator structure having a buried layer having a thickness of about 0.6 μm and a device layer having a thickness of about 1.5 μm.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

The following description of embodiment(s) is merely illustrative in nature and is in no way intended to limit the invention, its application, or uses. The present application includes, among other things, providing a semiconductor substrate including: a base substrate having a first semiconductor material; a buried structure; and a device layer having a second semiconductor material, where the buried structure is disposed between the base substrate and the device layer; and laser inscribing the semiconductor substrate, where the buried structure has a thickness equal to about $k \times \lambda_{laser}/(2 \times n)$, where: $\lambda_{laser}$ is a wavelength of peak emission for the light applied to inscribe the semiconductor substrate; k is an integer greater than zero (1, 2, 3 . . . ); and n is an index of refraction for the buried structure.

Applicants have discovered that interference of laser light within the layered structure of a semiconductor wafer can result in significant reflection or interference of the incident light. If the light is reflected and does not penetrate the layered structure deep enough, the material may not melt or ablate in response to the laser. If the light is refracted or internally reflected the material may overheat and create a large or distorted spot. The problems with laser scribing or marking of layered substrates may appear over the whole wafer surface as well as only within localized areas.

Applicants have discovered that if the thicknesses of the layers and their optical properties are "unfavorable", then marking of the wafer may not result in the desired identification of the wafer. Problems with laser scribing may be caused by thickness variability of the layers of the semiconductor material on a semiconductor wafer. For example, the spot size in a wafer identification character or barcode may not have controlled dimensions and appearance. Also, the interaction of the laser with the semiconductor structure may result in marks that are not predictable, thus, not readable, such as by automated readers.

Figure 1B:
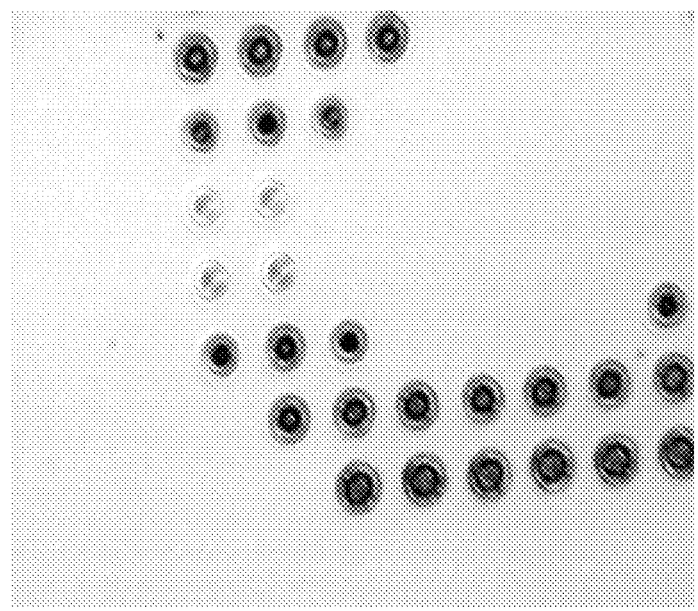
FIG. 1B illustrates one example of identification marks formed by prior laser marking methods on a silicon-on-insulator structure having a buried layer having a thickness of about 1 μm and a device layer having a thickness of about 3 μm.

FIG. 1A illustrates one example identification marks formed by prior laser marking methods on a silicon-on-insulator structure having a buried layer having a thickness of about 0.6 µm and a device layer having a thickness of about 1.5 µm. The laser marking was produced using light with a wavelength of peak emission of about 1064 nm. Without being bound to any particular theory, applicants believe this variation results from slight thickness changes in the device layer. FIG. 1B illustrates another example of identification marks formed by prior laser marking methods on a silicon-on-insulator structure having a buried layer having a thickness of about 3 µm and a device layer having a thickness of about 1 µm. The laser marking was also produced using light with a wavelength of peak emission of about 1064 nm. Note the "standing wave" appearance in both figures across the character set as the light is passing through a layer thickness that is a multiple of the incident light wavelength.

The dependence of the "size" of the laser scribe mark on the device layer thickness is illustrated in FIG. 1A. Variations of the device layer thickness are shown as the interference color band pattern visible. The "problematic" laser spots (the small ones) are localized in bands corresponding to certain interference fringes, which correspond to regions in the device layer having certain thicknesses.

Applicants have surprisingly discovered methods of laser scribing that can reduce or eliminate the deficiencies of prior laser scribing methods. The methods can, in some embodiments, produce generally uniform laser markings (e.g., uniform size and/or darkness) regardless of the thickness or thickness variation of the device layer. The present application also relates to semiconductor substrates and semiconductor chips that, in some embodiments, can be obtained by the methods disclosed herein.

Figure 2:
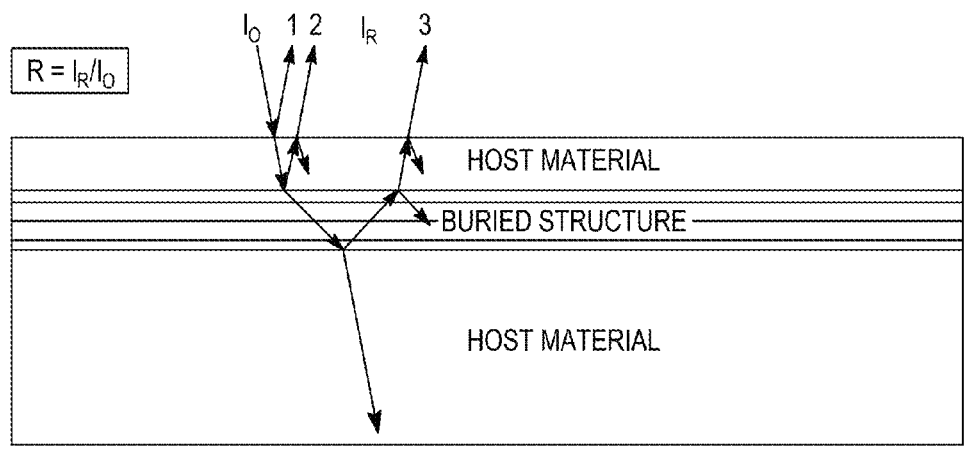
FIG. 2 schematically illustrates (not to scale) one example of the reflection of light from a layered structure.

FIG. 2 is a ray diagram that schematically illustrates the reflection of light from a layered structure including a buried structure of several layers. An arrow identified as $I_0$ represents near-normal incident light. Arrow 1 represents reflected light, and arrow 2 represents light reflected from the first interface, along with subsequent transmissions and reflections at interfaces with discontinuities of the dielectric constants. Additional multiple reflections and refraction may occur as illustrated by other arrows.

The total intensity of the reflected light, $I_R$, is the sum of beams 1, 2, 3, and more, i.e., all beams after reflections from all interfaces, including multiple reflections back and forth in each layer. Some embodiments disclosed herein include selecting a layered system and wavelength of light for laser marking the layered system so that the marking exhibits improved legibility, machine-readability, uniformity, and/or darkness. Without being bound to any particular theory, it is believed that, in some embodiments, the amount of reflected light is reduced during laser marking. In some embodiments, the dependence of the reflected intensity on the thickness of the "top" layer (e.g., device layer) is suppressed. As a consequence, the stable formation of laser marks may be improved and may not be substantially deteriorated by common variations in the thickness of the top layer.

Figure 3:
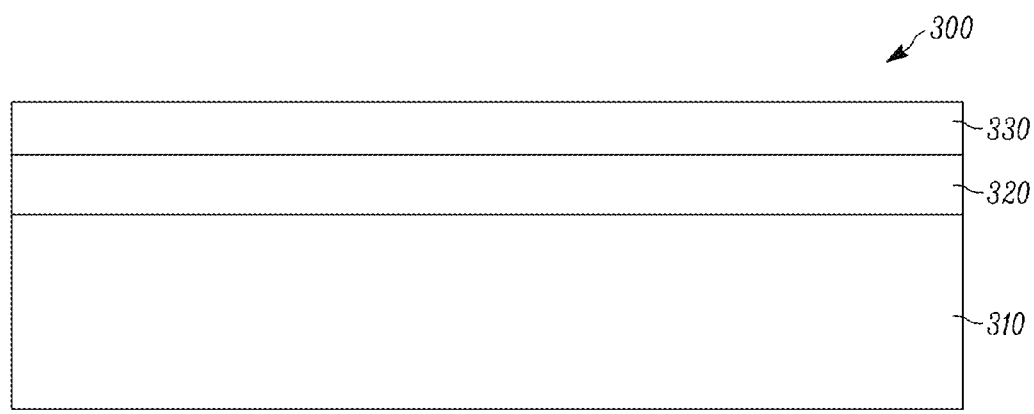
FIG. 3 is a cross-sectional view (not to scale) of one example of a layered structure that can be laser marked according the methods disclosed in the present application.

FIG. 3 is a cross-sectional view of one example of a layered structure that can be laser marked according some embodiments of the methods disclosed in the present application. Layered structure 300 includes base substrate 310, buried layer 320, and device layer 330. In some embodiments, the layered structure (e.g., layered structure 300) is a semiconductor substrate. In some embodiment, the layered structure is a silicon-on-insulator (SOI) structure. The layered structure may be, for example, a semiconducting wafer that may be used to manufacture one or more semiconductor devices. Although buried layer 320 is illustrated as coextensive with base substrate 310 and device layer 330, the skilled artisan will appreciate that the present application is not limited to this configuration. For example, the buried structure may be embedded within base layer and device layer. Furthermore, a three-layered structure is illustrated for simplicity, however more complex structures are within the scope of the present application. For example, the layered structure may contain multiple, distinct buried structures in separate regions. In these instances, the thickness of the buried structure aligned with the region that is laser marked may be used to determine appropriate laser marking conditions or layered structure dimensions.

The materials within the layered structure are not particularly limited and may be selected according to design choices. In some embodiments, the base substrate (e.g., base substrate 310) is a semiconducting material. The base substrate can be, for example, silicon, GaN, SiC, sapphire, or any other suitable material.

In some embodiments, the buried structure (e.g., buried layer 320) can be an insulating material. In some embodiments, the buried structure is a homogenous material. In some embodiments, the buried structure is a non-absorbing material for the light applied to the layered structure when laser marking. The buried structure can be, for example, silicon dioxide, AlN, AlGaN or any other suitable material.

In some embodiments, the device layer (e.g., device layer 330) is a semiconducting material. The device layer can be, for example, silicon, GaN, SiC, sapphire, or any other suitable material. In some embodiments, the device layer is monocrystalline (e.g., single crystal silicon). In some embodiments, the device layer and base substrate are the same material. In some embodiments, the device layer and base substrate are different materials. In some embodiments, the buried structure is an oxide of either the device layer or the base substrate. For example, the device layer can be silicon and the buried structure can be silicon dioxide. As a non-limiting example, the layered structure can have a base substrate that is silicon, a buried structure that is silicon dioxide, and a device layer that is silicon.

The dimensions of the layered structure are not particularly limited and may be selected according to design choices. In some embodiments, the dimension may be selected at least in part based on the wavelength of peak emission for a laser that is used to mark the layered structure. The base substrate can have a thickness of, for example, at least about 50 µm; at least about 100 µm; at least about 250 µm; or at least about 300 µm. The base substrate can have a thickness of, for example, less than or equal to about 1.5 mm; less than or equal to about 1 mm; less than or equal to about 750 µm; or less than or equal to about 650 μm. In some embodiments, the thickness of the base substrate can be about 50 μm to about 1.5 mm, or about 250 μm to about 750 μm. Non-limiting examples of thicknesses for the base substrate include 525 μm or 625 μm.

The buried structure can have a thickness of, for example, at least about 0.001 μm; at least about 0.1 μm; or at least about 0.5 μm. The buried structure can have a thickness of, for example, less than or equal to about 5 μm; less than or equal to about 3 μm; less than or equal to about 1.5 μm; or less than or equal to about 1 μm. In some embodiments, the buried structure has a thickness of about 0.01 μm to about 5 μm, or about 0.1 μm to about 1.5 μm.

The device layer can have a thickness of, for example, at least about 0.1 μm; at least about 1 μm; at least about 3 μm; at least about 10 μm; or at least about 50 μm. The device layer can have a thickness of, for example, less than or equal to about 500 μm; less than or equal to about 250 μm; less than or equal to about 150 μm; or less than or equal to about 100 μm. In some embodiments, the device layer has a thickness of about 0.1 μm to about 500 μm, or about 1 μm to about 150 μm.

In some embodiments, the layered structure is a silicon-on-insulator (SOI) wafer. The methods of the present application are not limited to any particular SOI wafer structure, and the SOI wafer can be prepared using standard techniques. Examples of techniques for the SOI wafer include, but are not limited to, SIMOX, Bond and Grind-back SOI (BGSOI), Bond and Etch-back SOI (BESOI), ELTRAN, or SMART-CUT. The SIMOX technology utilizes oxygen implantation and subsequent annealing to separate the device layer and substrate by a layer of buried oxide. The other technologies utilize bonding of two wafers (device wafer and handle wafer), where at least one wafer has the bonded surface covered by an insulating layer such as silicon oxide or silicon nitride. The bonded surfaces are joined by hydrogen bonds at first, but more covalent-like bonds are formed after high temperature annealing. The technologies differ in the thinning of the device wafer in order to reach the desired device layer thickness. The BGSOI technology uses grinding and polishing. BESOI utilizes selective etching to a predefined etch-stop layer formed in the device wafer prior to the bonding. ELTRAN is based on porous silicon layer and wafer cut. Other methods may utilize hydrogen ion implantation into the device wafer before the bonding step. Strain is created during annealing in the implanted region leading to a controlled delamination, thus separating the SOI structure from the rest of the device wafer leaving the thin layer attached to the handle wafer and oxide layer. Other methods of making the SOI wafer may be used.

The manufacturing procedures for SOI wafers can result in variability of the device layer thickness. Without being bound to any particular theory, the variability of the device layer thickness is believed to make it difficult to produce machine-readable laser markings on the substrate. The thickness variations may be especially pronounced in the near-perimeter area, where laser scribing is typically formed. The variability of the device layer thickness may modify the amount of the light penetrating the surface region and alter the resonance condition, and thus influences the quality of the laser marking. The larger the nominal device layer thickness the greater the interference spectrum. Local variability also has an influence.

The thickness of the buried structure may, in some embodiments, be proportional to the wavelength of peak emission for a laser that is used to mark the layered structure. By selecting a thickness for the buried structure based on the wavelength of peak emission for the laser, the layered structure can exhibit improved marking properties (e.g., more uniform marks). Without being bound to any particular theory, it is believed the interferences above the buried structure on the laser light can be reduced and the influence of the device layer thickness on the amount of penetrating light may also be decreased. This can reduce problems with laser marking for any thickness of the device layer.

In some embodiments, the thickness (d) of the buried structure can be according to Equation (1):

$$d = k \times \lambda_{laser}/(2 \times n) \qquad (1)$$

where:
$\lambda_{laser}$ is the wavelength of the laser light,
k is an integer greater than zero, and
n is the refractive index of the buried structure.

As a non-limiting example, a layered structure may contain a silicon dioxide buried structure having an index of refraction equal to about 1.45. When using a Nd:YAG laser having a wavelength of peak emission of about 1.06 μm for laser marking the layered structure, the thickness of the buried structure can be about 0.365 μm (k=1), about 0.73 μm (k=2), 1.095 μm (k=3), etc. When using a frequency doubler combined with the Nd:YAG laser to obtain a wavelength of peak emission of about 0.53 μm, the thickness of the buried structure can be about 0.18 μm (k=1), about 0.36 μm (k=2), 0.54 μm (k=3), etc. In another non-limiting example, a layered structure may contain an AlN buried structure having index of refraction equal to about 2.13. When using a Nd:YAG laser having a wavelength of peak emission of about 1.06 μm for laser marking the layered structure, the thickness of the buried structure can be about 0.25 μm (k=1), about 0.5 μm (k=2), 0.75 μm (k=3), etc.

Also as will be discuss further below, some embodiments of the laser marking method (e.g., laser scribing) include forming a laser mark on a semiconductor wafer using a laser with a wavelength of peak emission as defined by Equation (1) for a given thickness d of the buried structure. That is, the wavelength of peak emission can be equal to $(2 \times d \times n)/k$. By selecting a wavelength of peak emission, improved marks can be formed on the structure by the laser. For example, it can reduce variations in the marks (e.g., which may result from variations in the thickness of the top layer of a semiconductor device).

Although the thickness of the device layer may vary, the thickness of the buried structure may be more easily controlled. In many silion-on-insulator wafer specifications, the buried structure is specified in a manner thinner than, or thicker than, a certain value, or a thickness range is allowed. Thus, the thickness of the buried structure may be selected to facilitate laser marking that may be more easily read or detected without adversely affecting the characteristic of the devices. In some embodiments, the layered structure (e.g., layered structure 300 as depicted in FIG. 3) used in the methods of the present application has a low variability in thickness for the buried structure (e.g., buried structure 320 as depicted in FIG. 3). The variability in thickness for the buried structure can be, for example, less than or equal to about 15%; less than or equal to about 10%; less than or equal to about 5%; less than or equal to about 3%; or less than or equal to about 1%.

As discussed above, variations in the device layer thickness (e.g., device layer 330 as depicted in FIG. 3) may have a reduced effect on the laser marking quality when selecting an appropriate laser wavelength and/or buried structure thickness. Thus, in some embodiments, the device layer of the layered structure can have a variation in thickness of at least about 3%; at least about 5%; at least about 7%; at least about 10%; or at least about 15%.

The skilled artisan, guided by the teachings of the present application, will appreciate that the wavelength of peak emission of the laser can be tuned using standard techniques. For example, the wavelength can be reduced using an optical frequency multiplier (e.g., a doubler) As another example, wavelength-selective optical elements may be use to a select a particular wavelength. The laser wavelength may therefore be tuned to an appropriate wavelength based on the thickness of the buried structure (e.g., using Equation (1)). In some embodiments, the laser marking is performed using a tunable laser. The tunable laser may permit selecting an appropriate wavelength of light to apply to the layered structure for forming the laser marking.

The wavelength of peak emission for the light applied to the layered structure for laser marking can be, for example, at least about 200 nm; at least about 400 nm; at least about 500 nm; at least about 600 nm; at least about 700 nm; at least about 800 nm; or at least about 1000 nm. The wavelength of peak emission for the light applied to the layered structure for laser marking can be, for example, less than or equal to about 1500 nm; less than or equal to about 1300 nm; less than or equal to about 1100 nm; less than or equal to about 1000 nm; or less than or equal to about 800 nm. In some embodiments, the wavelength of peak emission for the light applied to the layered structure for laser marking can be about 200 nm to about 1500 nm. In some embodiments, the wavelength of peak emission for the light applied to the layered structure for laser marking can be in the near infrared.

Figure 4:
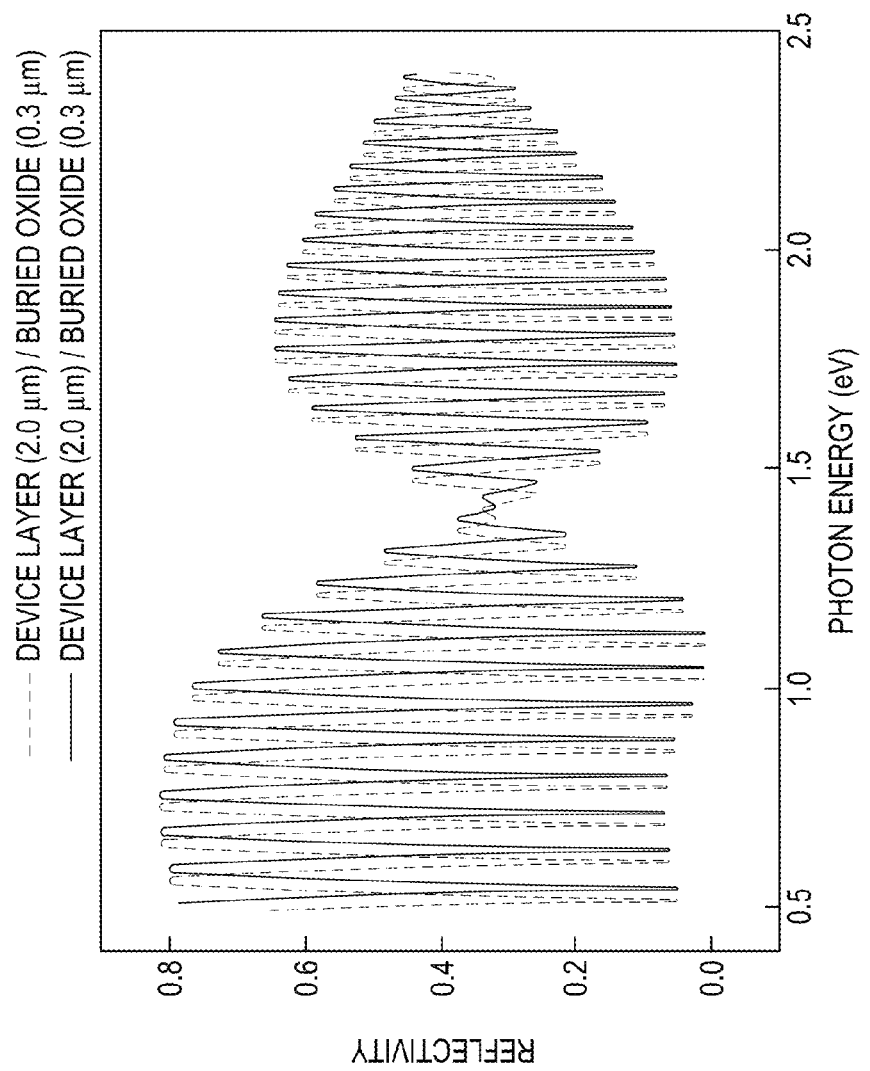
FIG. 4 is a graph showing an example of the reflectivity relative to photon energy for two silicon-on-insulator layered structures.

FIG. 4 is a graph showing an example of the reflectance relative to photon energy (which is inversely proportional to the wavelength) for two silicon-on-insulator layered structures. The dashed line illustrates a wafer having a device layer (approximately 2.0 µm thick) and a buried structure (approximately 0.3 µm thick). The solid line illustrates a wafer having a device layer (approximately 2.1 µm thick) and a buried structure (approximately 0.3 µm thick).

Without being bound to any particular theory, it is believed that a lower reflectivity produces larger, more uniform laser markings. The reflectivity is an oscillating function dependent on the thickness of the top silicon layer (device layer) and the buried layer. Due to these oscillations the amount of light reflected from the layered structure may vary from desirably low values to unacceptably high values with only a small change in the device layer thickness. However at about ~1.4 eV (or about 0.89 µm in wavelength), both plots exhibit similarly low reflectance. It is within the vicinity of these nodes where laser marking can be performed to obtain markings that do not significantly vary with the thickness of the device layer. In other words, near the node at about ~1.4 eV, variations in the thickness of the device layer do not substantially affect the laser marking outcome.

Figure 5:
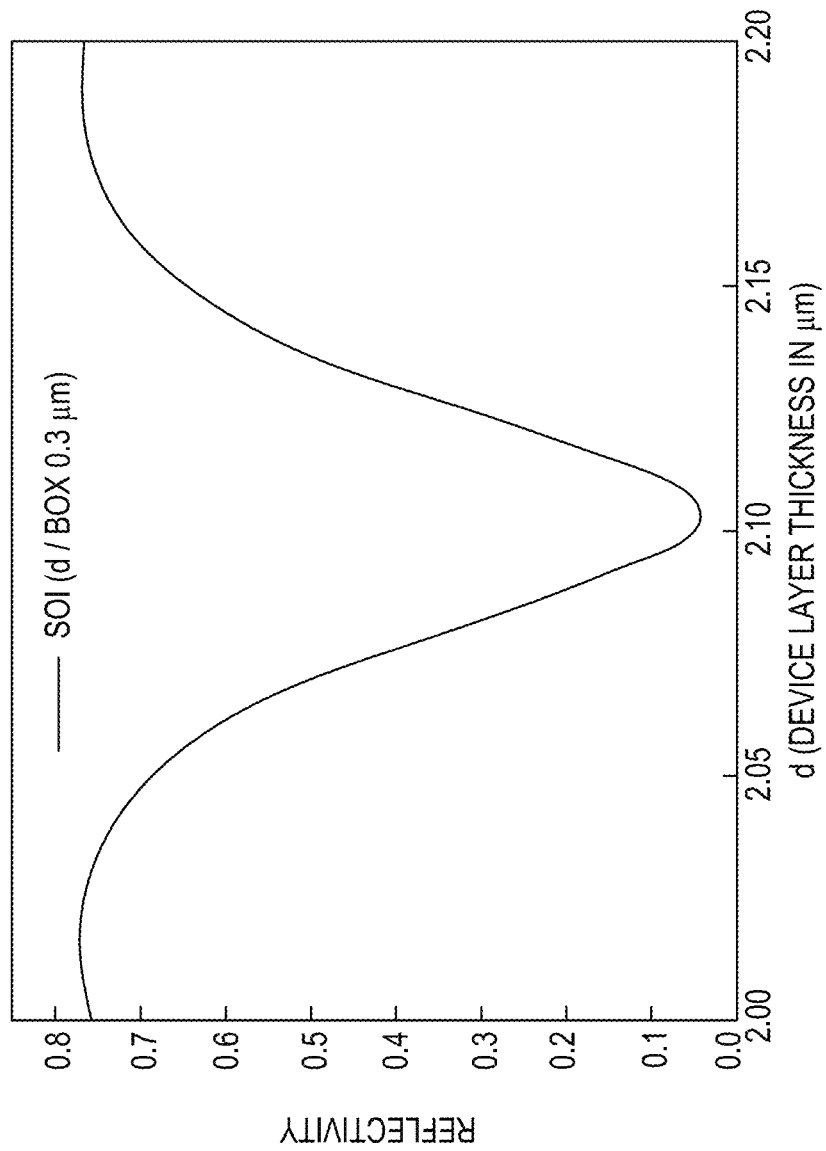
FIG. 5 is a graph showing an example of the reflectivity relative to the device layer thickness for a silicon-on-insulator structure having a buried structure with a thickness of about 0.3 μm and at a photon energy of 1 eV.

FIG. 5 is a graph showing an example of the reflectivity relative to the device layer thickness for a layered structure having a buried structure (BOX) with a thickness of about 0.3 µm and at a photon energy of 1 eV (or about 1.24 µm in wavelength). FIG. 5 demonstrates that the reflectance can vary significantly with small changes in the device layer thickness. For example, an increase in device layer thickness from 2.10 µm to 2.15 µm (an approximately 2% increase) increases the reflectivity from about 0.05 to about 0.7.

The interferences of the laser light in the layered structure are caused by multiple reflections from the optical interfaces present in the structure. This interference (and therefore increased reflection) is not present in bulk silicon or other bulk semiconductor wafers. Therefore, if the BOX is not present, or is not "visible" to the light with the given wavelength, the interference pattern vanishes and the reflectivity cannot rise above a critical value.

The interferences may be reduced if the buried structure is generally homogenous and made from a non-absorbing material. In one on-limiting example, the phase-shift caused by the light traveling through the buried structure can be approximately an integer multiple of 2×pi (the Ludolphine number). One example of an embodiment with such conditions may have a buried structure thickness, d [µm]:

$$d = k \times 0.62/(n \times E_{laser}) \qquad (2)$$

where k is an integer (1, 2, 3, ... );
n is the refractive index of the buried layer;
$E_{laser}$ is the energy of the light in electronvolts; and
0.62 is a constant calculated from Planck's constant, the velocity of light in vacuum, and conversion to energy in electron volts.

If the buried structure thickness fulfilling this condition is pre-selected, the laser light is not substantially influenced by the interferences above the buried structure and the device layer thickness has little effect on the amount of penetrated light.

In the graph of FIG. 4, such conditions are fulfilled for a photon energy of ~1.4 eV, where all spectra for the same buried structure thickness have a nodal form. Position of this node should be therefore shifted to the photon energy of the laser light with the proper selection of the buried structure thickness.

Figure 6:
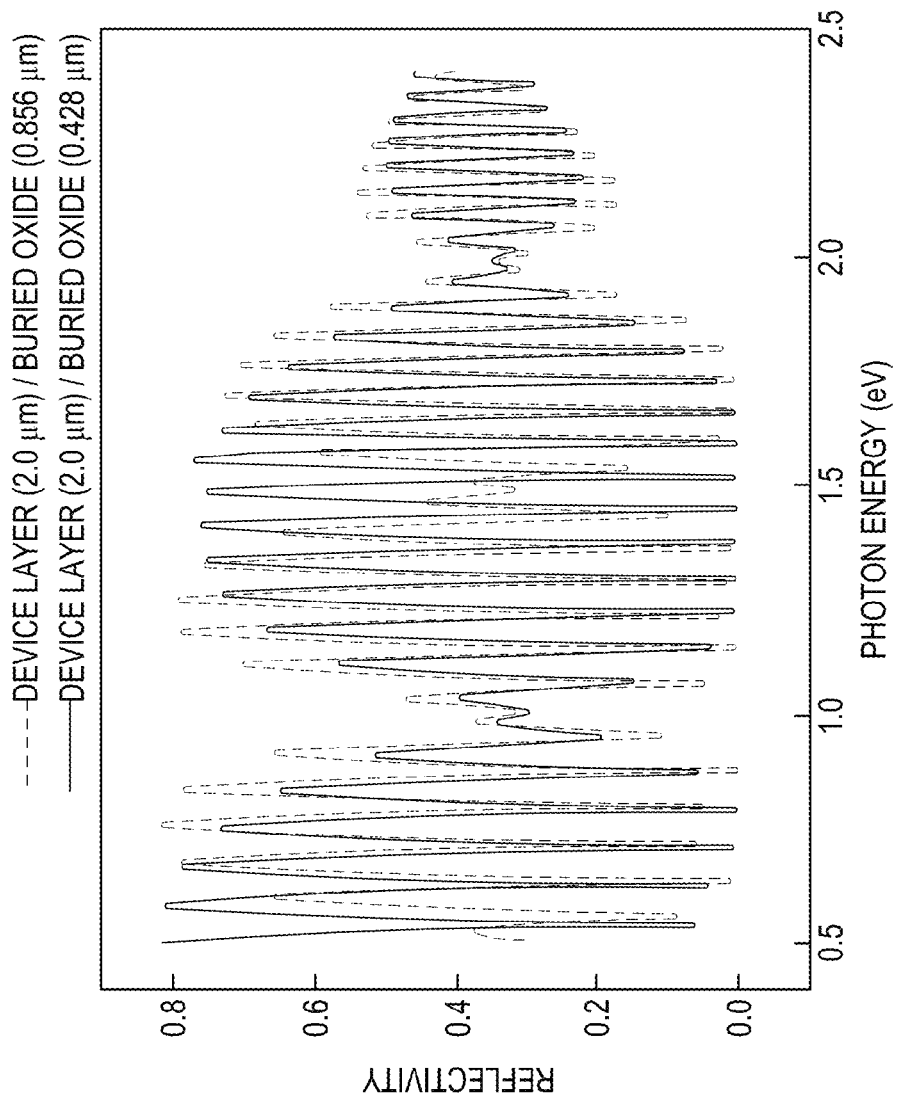
FIG. 6 is a graph showing an example of the reflectivity relative to the photon energy for two silicon-on-insulator structures.

FIG. 6 is a graph showing an example of the reflectivity relative to the photon energy for two layered structures. The solid line is a wafer having a device layer of about 2.0 µm thick and a buried oxide of about 0.428 µm thick. The dashed line is a wafer having a device layer of about 2.0 µm and a buried oxide of about 0.856 µm thick. Note the multiple null regions, and the different resonant conditions for different silicon-oxide layer combinations. The reflectivity spectrum is calculated for a buried structure thickness with a laser photon energy of 1 eV. The reflectivity is illustrated to be only about 0.3 (reflectivity of bare silicon) for both buried structure thicknesses: 428 nm and 2×428=856 nm. For a standard Nd:YAG laser with a wavelength 1064 nm (1.165 eV) and buried structure index of refraction of 1.45, d=k×367 nm. This calculation can be made for a buried oxide structure (e.g., in silicon-on-insulator structures), but can also apply to any non-absorbing layer or system of non-absorbing layers. If the system also includes absorbing layers, the dependence on the device layer thickness can be further reduced with the proper selection of the layer thicknesses.

In some embodiments, Equation (2) may be satisfied by changing $\lambda_{laser}$. For example, for a layered structure thinner than $\lambda_{laser}/(2 \times n)$, a laser with shorter wavelength (higher photon energy) may be beneficial.

Figure 7:
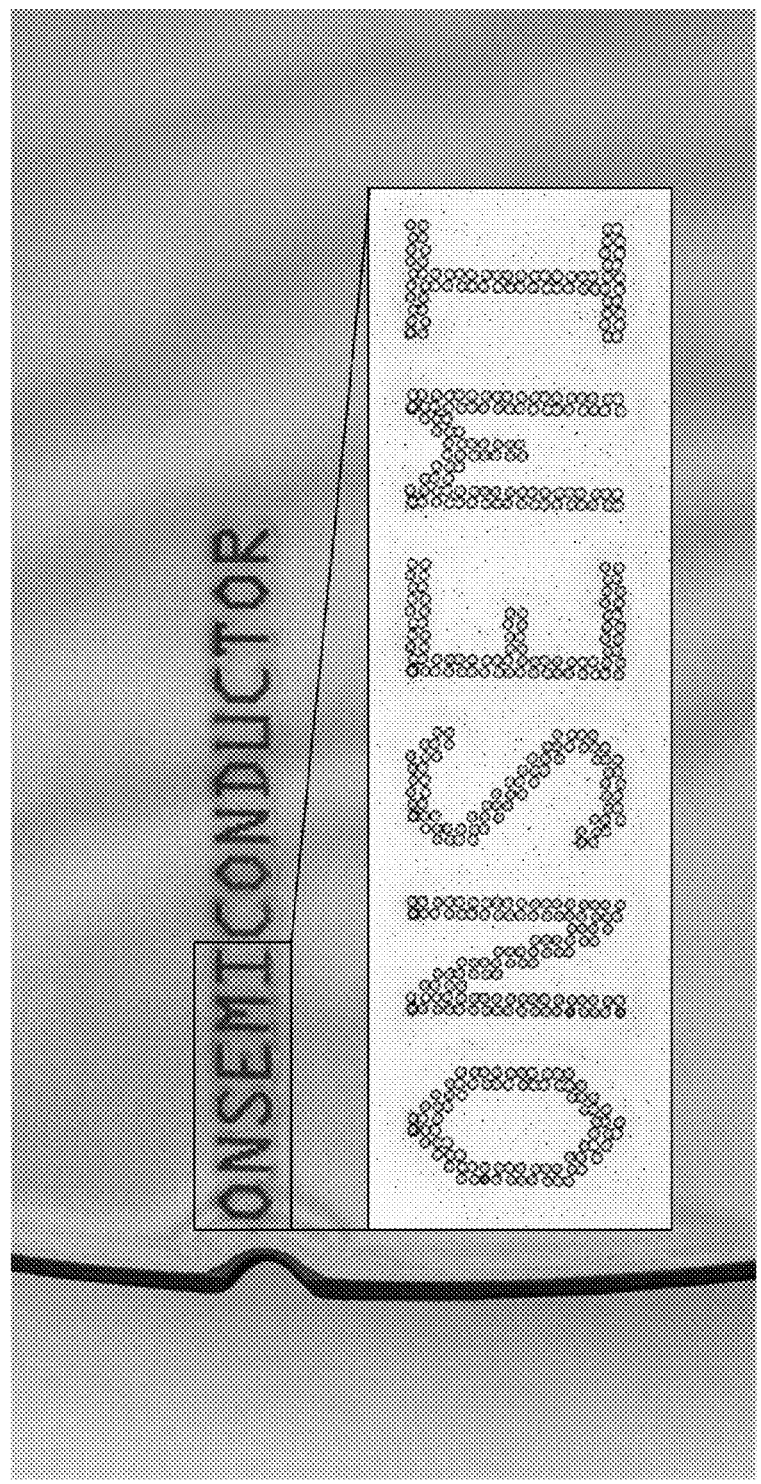
FIG. 7 illustrates one example of identification marks formed by laser marking methods on a silicon-on-insulator structure according to some embodiments of the present application.

FIG. 7 illustrates one example of identification marks formed by laser marking methods on a silicon-on-insulator structure according to some embodiments of the present application. The silicon device layer was about 3 µm thick and the silicon oxide insulating layer was about 720 nm thick. A Nd:YAG laser having a wavelength of peak emission of about 1064 nm was used to laser mark the silicon-on-insulator structure. By way of comparison between FIG. 7 and FIGS. 1A and 1B, the laser markings are more uniform in size and darkness regardless of the interference pattern when applied according to some embodiments of the present application.

In some embodiments, the laser marking can be improved (e.g., uniform spot size) by adding an "anti-reflection" surface layer. The reflection from the interface may be high if there is a large difference in the refractive indices. A thin non-absorbing surface layer with an index of refraction in-between the index of refraction of the wafer and the ambient will enable more light to penetrate into the sample. For example, a thin silicon oxide surface layer on a silicon wafer will reduce the surface reflectivity. In some embodiments, the non-absorbing layer has a thickness about 0.05 µm to about 10 µm, about 0.1 µm to about 2 µm, or about 0.1 µm to about 1 µm Thus, in some embodiments, the thickness of the layered structure may be formed to facilitate laser marking a substrate and enabling detection/reading of the laser marks.

Some embodiments disclosed herein include a method of laser marking that can include determining a thickness of a buried structure, selecting a wavelength of peak emission of light for laser marking the layered structure based on the thickness of the buried structure, and laser marking the layered structure using the light having the selected wavelength of peak emission. The wavelength can be determined, for example, using Equations (1) or (2) disclosed above. In some embodiments, the wavelength of peak emission is approximately equal to $(2 \times d \times n)/k$, wherein: d is a thickness of the buried structure; k is an integer greater than zero (1, 2, 3 ...); and n is an index of refraction for the buried structure.

The procedure for determining the thickness of the buried structure is not particularly limited. In some embodiments, the thickness can be determined by receiving data that corresponds to the thickness of the buried structure. As an example, a user may provide the thickness of the buried structure for one or more layered structures to a controller for a laser marking device (e.g., using a keyboard). As another example, a controller for the laser marking device can electronically receive over a network manufacturing condition, a lot number, or other information that corresponds with the thickness of the buried structure. In some embodiments, a machine readable identifier can be used to determine the thickness. For example, the layered structure may have a bar code, machine-readable letters, and the like disposed on the layered structure or packaging that contains the layered structure. A reader (e.g., a bar code scanner or machine vision) can be used to read the machine-readable identifier and determine the buried structure thickness based on information associated with the machine-readable identifier. In some embodiments, the thickness can be determined using known measurement techniques, such as ellipsometry or Fourier Transform Infrared Reflectance (FTIR).

Selecting the wavelength of peak emission can include, in some embodiments, tuning an output of a laser to the wavelength of peak emission for laser marking the layered structure. The wavelength of peak emission of the laser can be tuned using standard techniques. For example, the wavelength can be reduced using an optical frequency multiplier (e.g., a doubler) As another example, wavelength-selective optical elements may be use to a select a particular wavelength. In some embodiments, the laser marking can be performed using a tunable laser, for example a gas-laser with different gases or blends of gases to change the emission wavelength.

Selecting the wavelength of peak emission can include, in some embodiments, selecting a laser from two or more lasers (e.g., two, three, four, five, or more lasers), where each laser has a different wavelength of peak emission.

The methods disclosed in the present application may also, in some embodiments, include additional operations that occur during standard semiconductor fabrication processes. For example, the method may include fabricating one or more integrated circuits in the semiconductor substrate having the laser marking. The fabrication may include standard procedures, such as etching, ion implantation, chemical vapor deposition, photolithography, and the like. In some embodiments, the method may include dicing the semiconductor substrate to form one or more semiconductor devices.

Some embodiments discloses herein relate to a method of analyzing the structure of a layered structure. The method can include, in some embodiments, forming two or more laser markings on a layered structure, where markings are formed using at least two different wavelengths of light to obtain different laser markings; and correlating the laser markings with a characteristic of the layered structure. The method can be used, for example, for quality control during manufacturing. By applying different laser markings with different wavelengths, the thickness of the buried structure may, in some embodiments, be inferred based, at least in part, on the wavelength of light that produced the most uniform laser spots. In some embodiments, the laser marking variability in the device layer may be correlated with the variability in thickness for the device layer.

The number of different wavelengths applied can be, for example, two, three, four, five, or more. In some embodiments, multiple laser spots are formed for each wavelength (e.g., two, three, four, five, ten, or more sports are formed for each wavelength). As a non-limiting example, an array of spots can formed, where each row of laser spots is formed by the same laser wavelength. The array can be, for example, 5 rows with 10 spots each. The pattern of the laser spots may then be used to infer characteristics of the layered structure. For example, the row with the most uniform markings may correlate with a thickness of the buried structure. As another example, variation in spot size along certain rows may be correlated with variations in the device layer thickness. The skilled artisan, guided by the teachings of the present application, will appreciate that other characteristics of the layered structure may be correlated based on the laser markings.

The skilled artisan will appreciate that various calculations relating to wavelength and thickness disclosed herein may include some variability. Accordingly, these calculations are approximate and can include some variability without departing from the scope of the present application. For example, the thickness of the buried structure may be calculated using Equation (1) to be 1 µm. Any thickness within 10% of this calculated thickness (i.e., a range from 0.9 µm to 1.1 µm) may be used in this example and is within the scope of the present application. Similarly, a variability of 10% is within the scope of the present application for the wavelength of peak emission. As used herein, the terms "about" and "approximately" can include variability of less than or equal 10%, or preferably less than or equal to 5%.

While the subject matter of the descriptions are described with specific preferred embodiments and example embodiments, the foregoing drawings and descriptions thereof depict only certain embodiments of the subject matter and are not therefore to be considered to be limiting of its scope, it is evident that many alternatives and variations will be apparent to those skilled in the art.

From all the foregoing one skilled in the art can determine that according to one embodiment, a method comprises: providing a semiconductor substrate including a base substrate having a first semiconductor material, a buried structure; and a device layer having a second semiconductor material, wherein the buried structure is disposed between the base substrate and the device layer; and laser marking the semiconductor substrate, wherein the buried structure has a thickness equal to about $k \times \lambda_{laser}/(2 \times n)$, wherein: $\lambda_{laser}$ is a wavelength of peak emission for the laser applied to mark the semiconductor substrate; k is an integer greater than zero (1, 2, 3 . . . ); and n is an index of refraction for the buried structure.

From all the foregoing one skilled in the art can determine that according to one embodiment, a method comprises: receiving a semiconductor substrate including a base substrate having a first semiconductor material, a buried structure, and a device layer having a second semiconductor material, wherein the buried structure is disposed between the base substrate and the device layer; determining a thickness of the buried structure; selecting a wavelength of peak emission for laser marking the semiconductor substrate such that the wavelength of peak emission is approximately equal to (2×d×n)/k, wherein: d is a thickness of the buried structure; k is an integer greater than zero (1, 2, 3 . . . ); and n is an index of refraction for the buried structure; and laser marking the semiconductor substrate using the selected wavelength of peak emission.

From all the foregoing one skilled in the art can determine that according to one embodiment, a semiconductor device comprises: a base substrate having a first semiconductor material; a buried structure; a device layer having a second semiconductor material, wherein the buried structure is disposed between the base substrate and the device layer; and a laser marking formed in the semiconductor substrate by applying a laser having a wavelength of peak emission that is approximately equal to (2×d×n)/k, wherein: d is a thickness of the buried structure; k is an integer greater than zero (1, 2, 3 . . . ); and n is an index of refraction for the buried structure.

In view of all of the above, it is evident that a semiconductor device and method is disclosed. Included, among other features, laser marking a layered structure using a wavelength of peak emission based on a thickness of the buried structure in the layered structure. Furthermore, laser-marked semiconductor devices formed according to the methods of the present application that have improved uniformity (e.g., uniform laser spot size and darkness).

While the subject matter of the invention is described with specific preferred embodiments and example embodiments, the foregoing drawings and descriptions thereof depict only typical embodiments of the subject matter and are not therefore to be considered to be limiting of its scope, it is evident that many alternatives and variations will be apparent to those skilled in the art.

What is claimed is:

1. A semiconductor substrate comprising:
   a base substrate having a first semiconductor material;
   a buried structure; and
   a device layer having a second semiconductor material, wherein the buried structure is disposed between the base substrate and the device layer,
   wherein the buried structure has a thickness equal to about $k \times \lambda_{laser}/(2 \times n)$, wherein:
   $\lambda_{laser}$ is a wavelength of peak emission;
   k is an integer greater than zero (1, 2, 3 . . . ); and
   n is an index of refraction for the buried structure.

2. The substrate of claim 1, wherein the base substrate is silicon, SiC, GaN, or sapphire.

3. The substrate of claim 1, wherein the buried structure is an insulating material.

4. The substrate of claim 1, wherein the buried structure is silicon dioxide, AlGaN, or AlN.

5. The substrate of claim 1, wherein the device layer is silicon, SiC, GaN, or sapphire.

6. The substrate of claim 1, wherein the device layer is monocrystalline.

7. The substrate of claim 1, wherein the thickness of the buried structure is about 0.001 μm to about 5 μm.

8. The substrate of claim 1, wherein a thickness of the device layer is about 0.1 μm to about 500 μm.

9. The substrate of claim 1, wherein the wavelength of peak emission for the light applied to inscribe the semiconductor substrate is about 200 nm to about 1,500 nm.

10. The substrate of claim 1, wherein the thickness of the buried structure is about 365 nm, 740 nm or 1095 nm.

11. The substrate claim 1, where the base substrate is silicon, the buried structure is silicon dioxide, and the device layer is silicon.

12. A semiconductor substrate comprising:
    a base substrate having a first semiconductor material;
    a buried structure; and
    a device layer having a second semiconductor material, wherein the buried structure is disposed between the base substrate and the device layer,
    wherein the buried structure has a thickness equal to about $k \times \lambda/(2 \times n)$, wherein:
    $\lambda$ is about 530 nm or about 1060 nm;
    k is an integer greater than zero (1, 2, 3 . . . ); and
    n is an index of refraction for the buried structure.

13. The substrate of claim 12, wherein the buried structure is an insulating material.

14. The substrate of claim 12, wherein the buried structure is silicon dioxide, AlGaN, or AlN.

15. The substrate of claim 12, wherein the buried structure is silicon dioxide.

16. The substrate of claim 15, wherein the base substrate is silicon, SiC, GaN, or sapphire.

17. The substrate of claim 12, wherein the thickness of the buried structure is equal to about k×367 nm.

18. The substrate of claim 12, wherein the device layer is monocrystalline.

19. The substrate of claim 12, wherein a thickness of the device layer is about 0.1 μm to about 500 μm.

20. The substrate claim 12, where the base substrate is silicon, the buried structure is silicon dioxide, and the device layer is silicon.

* * * * *